United States Patent

Nezu

Patent Number: 5,475,325
Date of Patent: Dec. 12, 1995

[54] CLOCK SYNCHRONIZING CIRCUIT

[75] Inventor: Toshiya Nezu, Tokyo, Japan

[73] Assignee: NEC Corporation, Tokyo, Japan

[21] Appl. No.: 186,522

[22] Filed: Jan. 26, 1994

[30] Foreign Application Priority Data

Mar. 12, 1993 [JP] Japan ................... 5-077475

[51] Int. Cl.⁶ ..................................... H03L 7/08
[52] U.S. Cl. ..................... 327/147; 327/150; 327/362; 327/512
[58] Field of Search ................... 307/155, 262, 307/491; 375/120; 331/1 A, 17, 25; 327/141, 144–150, 152, 153, 155–159, 162, 163, 231, 233, 236, 241, 243–250, 512, 513, 362, 371

[56] References Cited

U.S. PATENT DOCUMENTS

| | | | |
|---|---|---|---|
| 3,725,789 | 4/1973 | Mager | 307/310 |
| 4,310,804 | 1/1982 | Ryon | 331/25 |
| 4,563,657 | 1/1986 | Oureshi et al. | 375/120 |
| 4,808,884 | 2/1989 | Hull et al. | 375/120 |
| 4,855,683 | 8/1989 | Troudet et al. | 328/155 |
| 5,018,170 | 5/1991 | Wilson | 331/25 |
| 5,024,535 | 6/1991 | Winston, Jr. | 327/512 |
| 5,168,245 | 12/1992 | Koskowich | 331/1 A |
| 5,268,601 | 12/1993 | Cossius | 327/362 |

Primary Examiner—Timothy P. Callahan
Assistant Examiner—T. Lam
Attorney, Agent, or Firm—Whitham, Curtis, Whitham & McGinn

[57] ABSTRACT

A clock synchronizing circuit includes a voltage controlled oscillator (VCO) for producing an output signal whose oscillation frequency changes in response to control signals. A phase comparator compares a phase of an input signal and a phase of the output signal to thereby generate a phase difference signal. A filter filters the phase difference signal to thereby output a filtered phase difference signal. A frequency synchronizing circuit responsive to the filtered phase difference signal generates a first compensation signal for controlling a frequency of the output signal. A phase synchronizing circuit responsive to the filtered phase difference signal generates a second compensation signal for controlling a phase of the output signal. A signal supplying circuit feeds the first and second compensation signals as the control signals.

13 Claims, 5 Drawing Sheets

CLOCK SYNCHRONIZING CIRCUIT

BACKGROUND OF THE INVENTION

The present invention relates to a clock synchronizing circuit and, more particularly, to a clock synchronizing circuit for synchronizing, in a network, a clock signal to be generated in a terminal node to a clock signal sent from a clock feeding device included in a master node.

It is a common practice with a large scale digital communication network to implement a network synchronizing system with a master-slave scheme. In a master-slave synchronizing system, a master node generates a clock signal with a clock generating device thereof and sends it to a terminal node. The terminal node generates a clock signal based on the received clock thereinside. A conventional clock synchronizing circuit using the master-slave scheme has a phase difference detector for producing a voltage signal representative of a phase difference between an input and an output clock signal, a low pass filter, and a voltage controlled oscillator (VCO) for producing a predetermined clock signal matching the voltage signal. The problem with such a clock synchronizing circuit is as follows. The frequency of the output clock signal is controlled on the basis of the phase difference between an input and an output clock signal. Hence, when the frequency of the input clock signal, which is the reference, is changed or interrupted for a moment due to jitter or similar cause, the phase difference detector detects the change or interruption and feeds the resulting output thereof to the VCO as a phase difference signal. As a result, the VCO outputs a clock signal proportional to the change in the frequency of the input clock signal. Moreover, in an application of the kind requiring a stable output clock signal, uncontrollable phase deviations occur since the output clock signal is controlled on the basis of a variation width produced by a temperature compensation circuit which is included in the VCO.

SUMMARY OF THE INVENTION

It is, therefore, an object of the present invention to provide a clock synchronizing circuit capable of producing a stable output clock signal even when the phase of an input clock signal changes.

A clock synchronizing circuit of the present invention comprises a VCO for producing an output signal whose oscillation frequency changes in response to control signals. A comparator compares the phase of an input signal and that of the output signal to thereby generate a phase difference signal. A filter filters the phase difference signal to thereby output a filtered phase difference signal. A frequency synchronizing section responsive to the filtered phase difference signal generates a first compensation signal for controlling the frequency of the output signal. A phase synchronizing section responsive to the filtered phase difference signal generates a second compensation signal for controlling the phase of the output signal. A signal supplying circuit feeds the first and second compensation signals as the control signals.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
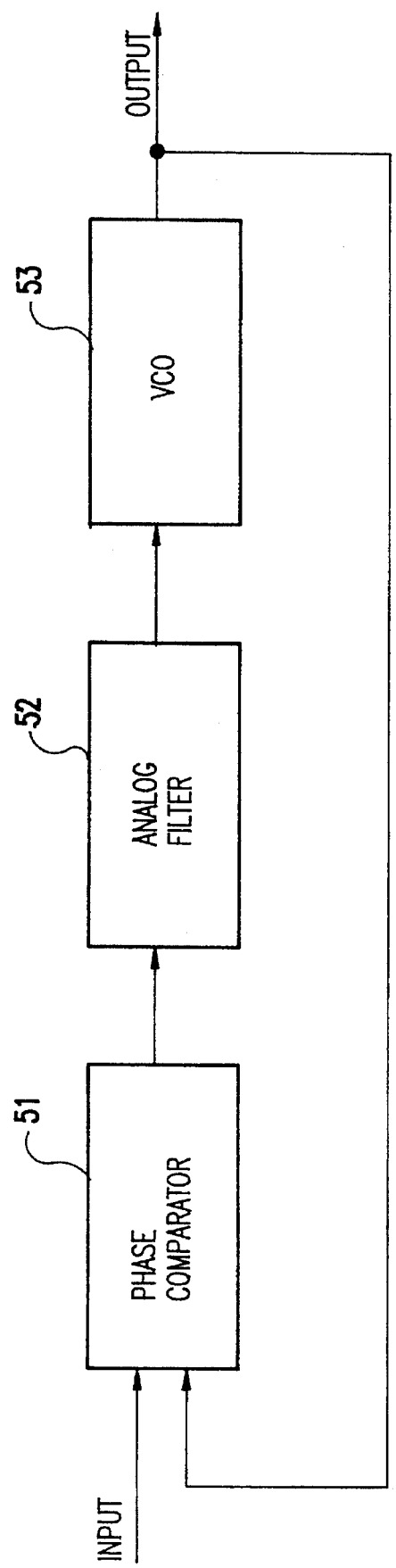
FIG. 1 is a block diagram schematically showing a conventional clock synchronizing circuit.

To better understand the present invention, a brief reference will be made to a conventional clock synchronizing circuit, shown in FIG. 1. As shown, the clock synchronizing circuit is made up of a phase comparator 51, a low pass filter or similar analog filter 52, and a voltage controlled oscillator (VCO) 53. The phase comparator 51 compares the phase of an input clock signal and that of an output clock signal and produces a voltage signal representative of the resulting phase difference. The voltage signal is routed through the analog filter 52 to the VCO 53. The VCO 53 produces a predetermined clock signal matching the input voltage signal.

Specifically, when a clock signal is input to the phase comparator 51 from the outside, the phase comparator 51 compares the phase of the clock signal being output from the VCO 53 with the phase of the input clock signal and then produces a voltage signal matching the resulting phase error in level. The analog filter 52 removes high frequency components from the output signal of the phase comparator 51. The output of the analog filter 52 is applied to the VCO 53. As a result, the voltage signal including the phase difference between the input and output clock signals plays the role of a control signal and finely adjusts the oscillation frequency of the output clock. A temperature compensation circuit is included in the VCO 53, although not shown specifically. When the ambient temperature changes, the temperature compensation circuit compensates the frequency-to-temperature characteristic of the VCO 53, thereby stabilizing the output clock signal.

However, the conventional clock synchronizing circuit described above cannot output a stable clock signal when the phase of the input clock signal changes, as disclosed earlier.

Figure 2:
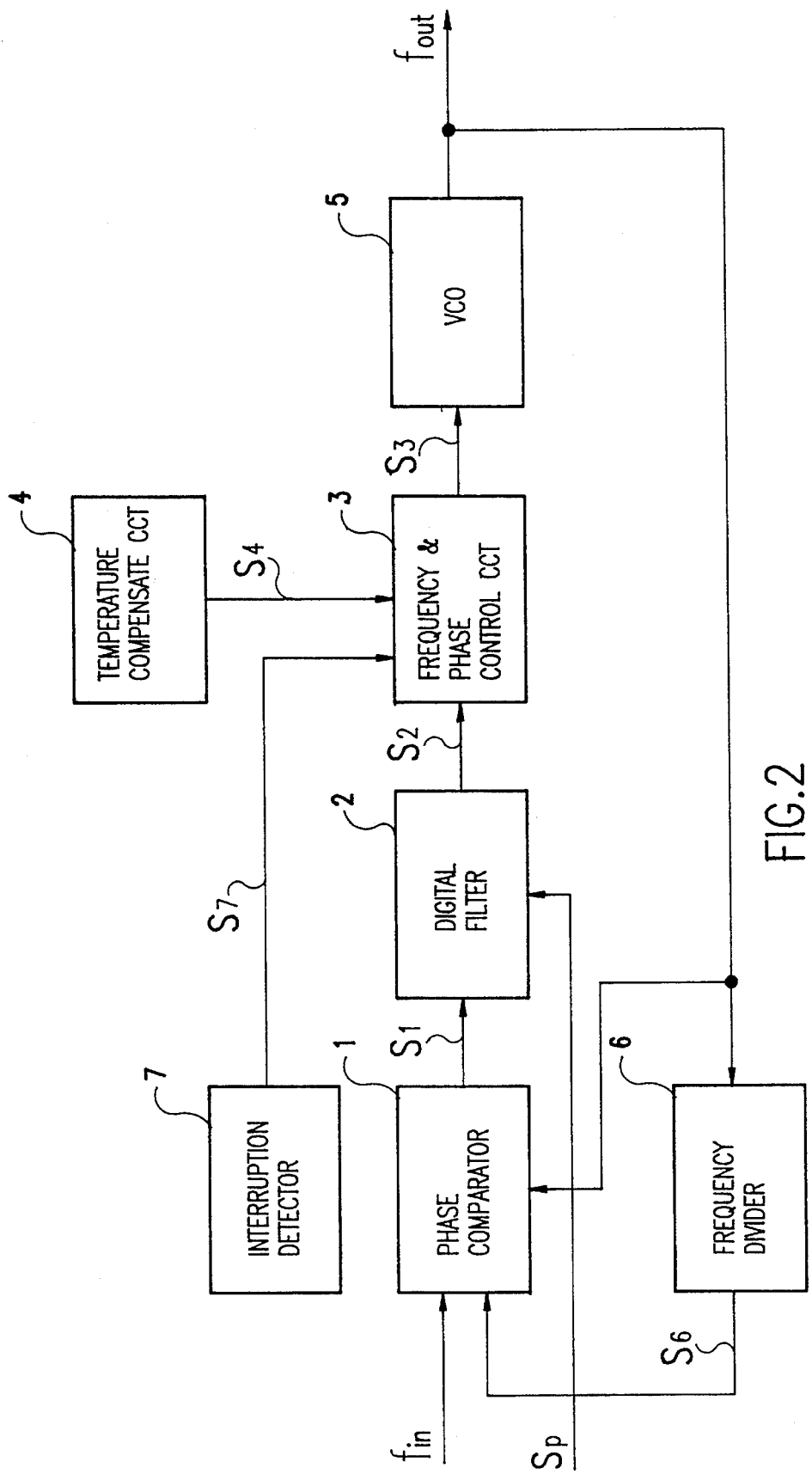
FIG. 2 is a block diagram schematically showing a clock synchronizing circuit embodying the present invention.

Referring to FIG. 2, a clock synchronizing circuit embodying the present invention is shown. As shown, in response to an input clock signal $f_{in}$, the clock synchronizing circuit produces an output clock signal $f_{out}$ whose frequency is substantially n times as high as the frequency of the input signal $f_{in}$. Specifically, the input clock signal $f_{in}$ is sent from a clock feeding device included in a master node, not shown, to the phase synchronizing circuit via a network. A phase comparator 1 compares the input clock signal $f_{in}$ with a signal $S_6$ which a frequency divider 6 outputs by dividing the output clock signal $f_{out}$ by 6. The phase comparator 1 delivers a digital signal $S_1$ representative of the phase difference between the two signals $f_{in}$ and $S_6$. A digital filter 2 removes phase fluctuation components of relatively high frequencies from the phase difference signal $S_1$, thereby producing a phase indication signal $S_2$ indicative of the advance/retard direction of the phase. A temperature compensation circuit 4 generates a temperature compensation signal $S_4$ matching the current ambient temperature. A frequency and phase control circuit 3 adds the temperature compensation signal $S_4$ and a control signal resulted from frequency and phase synchronization control which is based on the phase indication signal $S_2$. The resulting output, or voltage control signal, $S_3$ of the control circuit 3 is applied to a VCO 5. In response, the VCO 5 generates an output clock signal $f_{out}$ based on a predetermined internal oscillation frequency. When the input clock signal $f_{in}$ is interrupted due to jitter or similar cause, a signal interruption detector 7 detects it and generates an input interruption signal $S_7$.

Figure 3:
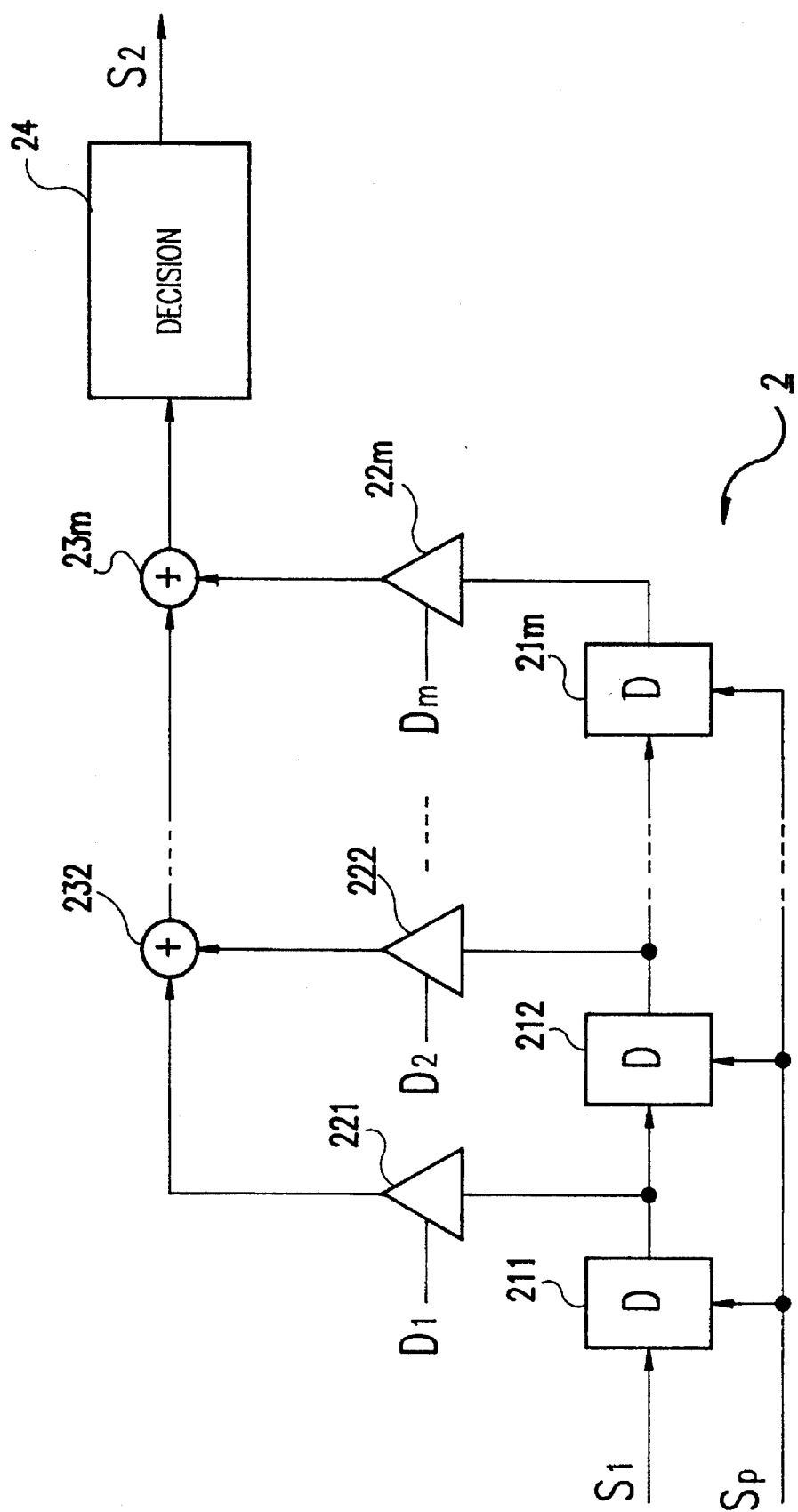
FIG. 3 is a schematic block diagram showing a specific construction of a digital filter included in the embodiment.

FIG. 3 shows a specific construction of the digital filter 2. As shown, the digital filter 2 has flip-flops 211-21m, multipliers 221-22m, adders 232-23m, and a decision section 24. The decision section 24 determines whether the phase difference is advanced or retarded by referencing the MSB (Most Significant Bit) of the result of addition output from the adders 232-23m, thereby producing a phase indication signal $S_2$.

In operation, assume that the phase difference signal $S_1$ input from the phase comparator 1 to the digital filter 2 has x bits. Then, the flip-flop 211 samples the x-bit signal $S_1$ as bit data in response to a predetermined sampling signal $S_p$. The multiplier 221 multiplies the bit data sampled by the flip-flop 211 by a filter coefficient $D_1$ which is stored in a ROM (Read Only Memory) beforehand and selected in consideration of a filter characteristic. The resulting product is applied to the adder 232 as digital data having a predetermined number of bits. In response to the next sampling signal $S_p$, the output of the flip-flop 211 is shifted to the next flip-flop 212 and sampled thereby. The multiplier 222 multiplies the output data of the flip-flop 212 by a filter coefficient $D_2$. At this instant, the flip-flop 211 samples a new phase difference signal $S_1$, and then the multiplier 221 multiplies the resulting output data of the flip-flop 211 by the filter coefficient $D_1$. The outputs of the multipliers 221 and 222 are added by the adder 232. In this manner, the phase difference signal $S_1$ is repeatedly sampled in response to the sampling signals $S_p$ the number of times corresponding to the number of taps m and multiplied by the predetermined filter coefficients $D_1$–$D_m$. As a result, m sums having a predetermined number of bits are applied to the decision section 24. The decision section 24 determines whether the MSB of the sums is a ZERO (retarded) or a ONE (advanced) and sequentially outputs phase indication signals $S_2$ in response to the sampling signals $S_p$, indicating whether the phase difference between the input and output clock signals $f_{in}$ and $f_{out}$ is advanced or retarded.

Figure 4:
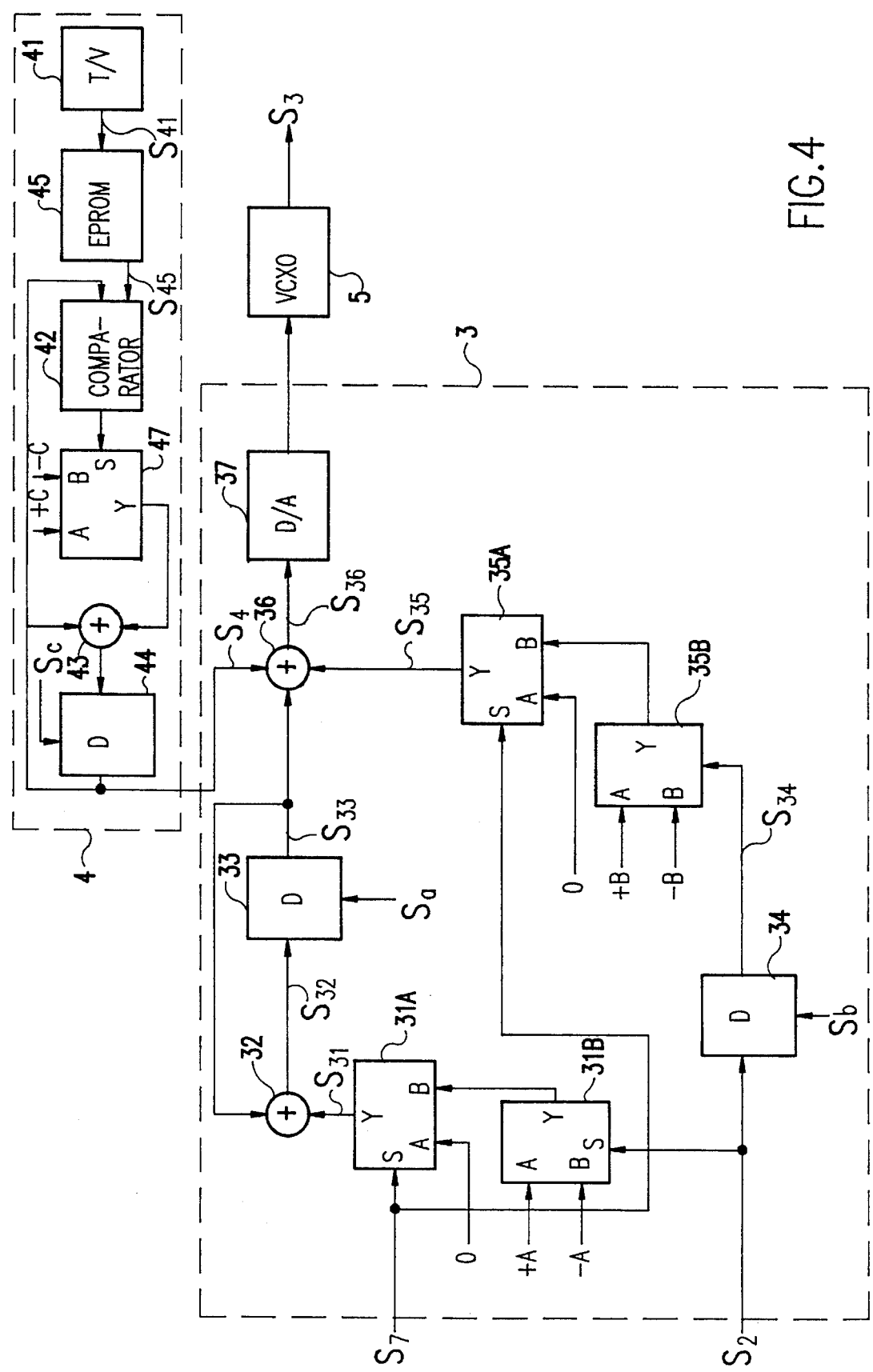
FIG. 4 is a block diagram schematically showing specific constructions of a frequency and phase control circuit and a temperature compensation circuit also included in the embodiment.

The frequency and phase control circuit 3 and temperature compensation circuit 4 are shown in FIG. 4 specifically. As shown, the frequency and phase control circuit 3 has selectors 31A, 31B, 35A and 35B, adders 32 and 36, flip-flops 33 and 34, and a digital-to-analog (D/A) converter 37. The selectors 31A, 31B, 35A and 35B output predetermined control quantities in response to input signals. The flip-flops 33 and 34 samples input signals thereof in response to sampling signals $S_a$ and $S_b$, respectively; the signals $S_a$ and $S_b$ each has a predetermined frequency. The D/A converter 37 transforms a digital input signal to an analog signal.

On the other hand, the temperature compensation circuit 4 has a temperature-to-voltage (T/V) converter 41, an EPROM 45, a comparator 42, an adder 43, a selector 47, and a flip-flop 44. The T/V converter 41 outputs a voltage signal $S_{41}$ matching a temperature measured. The EPROM 45 generates a temperature compensation signal $S_{45}$ matching the voltage signal $S_{41}$ applied thereto. The EPROM 45 stores voltage data to compensate a temperature-frequency characteristic of the VCO. Specifically, the ROM 45 memorizes the voltage data such that when a temperature change causes a frequency increase, the voltage data compensate the frequency change to lower the frequency. The comparator compares the current control voltage with the compensation voltage from the ROM 45 and sends the comparison result to the selector 47. The selector 47 is responsive to the comparison result to select a predetermined control quantity ±C. The adder 43 adds the quantity ±C to the current control voltage. The flip-flop 44 samples the output signal of the adder 43 every sampling period $S_c$ to produce the signal $S_4$.

The frequency of the sampling signal $S_p$ used in the filter 2 is set at the same as that of the sampling signal $S_b$, whereas the frequency of the sampling signal $S_a$ is the same as that of the signal $S_c$. Also, the frequency $S_b$ is higher than the frequency $S_a$ to effect the frequency control faster than the phase control. For the similar reason, a quantity B is larger than the quantity A. The signals $S_p$, $S_a$–$S_c$ are obtained by frequency dividing the output signal $f_{out}$. In this embodiment, these frequencies of $f_{in}$, $f_{out}$, $S_p$, $S_a$–$S_c$ are set at as follows: $f_{in}$=1.544 MHz, $f_{out}$=12.96 MHz, $S_p$=$S_b$=333 Hz, and $S_a$=$S_c$=5 Hz.

Figure 5:
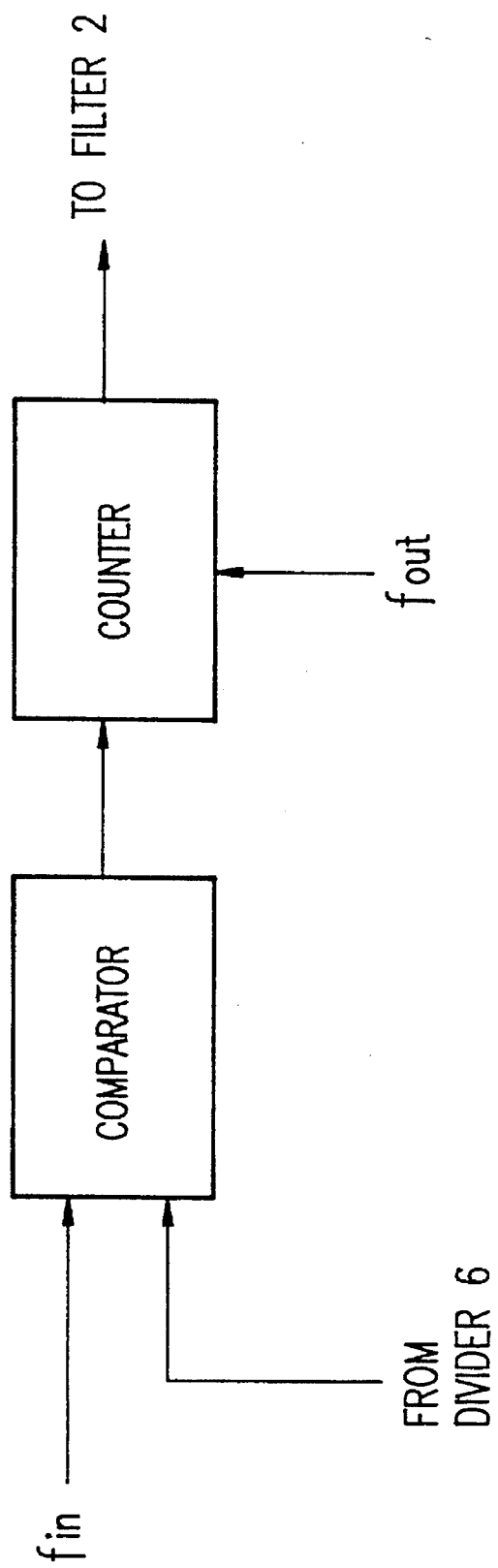
FIG. 5 is a block diagram showing a specific construction of a phase comparator.

FIG. 5 shows a specific construction of the phase comparator 1. As shown, the comparator 1 comprises a comparator 11 formed of an EX-OR circuit to produce a comparison result. A counter 12 is responsive to the pulse from the VCO 5 for counting a comparison result from the comparator 11, and produces the phase difference signal.

In the above construction, when a phase indication signal $S_2$ is input to the frequency and phase control circuit 3, the selectors 31A and 31B feed, for frequency synchronization control, a predetermined control quantity A (signal $S_{31}$) matching the phase indication signal $S_2$ to the adder 32. Specifically, when the previously mentioned input interruption signal $S_7$ is absent, the selectors 31A and 31B output a control quantity ±A, depending on whether the signal $S_2$ is a ZERO or a ONE. The output $S_{31}$ of the selector 31A is added to a signal $S_{33}$ fed back from the flip-flop 33 by the adder 32. The resulting output $S_{32}$ of the adder 32 is sampled by the flip-flop 33 every predetermined sampling period $S_a$. The signal $S_{33}$ sampled by the flip-flop 33 is applied to the adder 36. As a result, when the phase difference between the input and output clock signals $f_{in}$ and $f_{out}$ is great, the circuitry executes efficient frequency synchronization control by using the control quantity A.

On the other hand, the phase difference signal $S_2$ is sampled by the flip-flop 34 for phase synchronization control every predetermined sampling period $S_b$. The output $S_{34}$ of the flip-flop 34 is fed to the selector 35B. In response, the selectors 35A and 35B deliver a predetermined control quantity B matching the signal $S_{34}$ to the adder 36. Specifically, when the input interruption signal $S_7$ is absent, the selectors 35A and 35B output a control quantity ±B, depending on whether the signal $S_{34}$ is a ZERO or a ONE. Consequently, when the phase difference between the input and output clock signals is small, the circuitry executes delicate phase synchronization control by using the control quantity B.

The temperature compensation signal $S_{45}$ output from the EPROM 45 and matching the output $S_{41}$ of the T/V converter 41 is compared by the comparator 42 with the temperature compensation signal $S_4$ being output then. The quantity ±C is added to the compensation signal $S_4$ by the adder 43. The resulting sum is applied to the flip-flop 44. The flip-flop 44 delivers the output thereof to the adder 36 every predetermined sampling period $S_c$. With this configuration, it is possible to compensate the frequency-to-temperature characteristic of the VCO 5 smoothly as desired, thereby preventing the phase of the output clock signal $f_{out}$ from changing abruptly.

The adder 36 adds the control signal $S_{33}$ resulted from the frequency synchronization control, the control signal $S_{35}$ resulted from the phase synchronization control, and the temperature compensation signal $S_4$ so as to produce a sum signal $S_{36}$. The sum signal $S_{36}$ is output via the D/A converter 37 as a voltage control signal $V_3$. In response to the voltage control signal $S_3$, the VCO 5 adjusts the internal oscillation frequency thereof for thereby producing a stable output clock signal $f_{out}$.

Assume that the signal interruption detector 7 has detected the interruption of the input clock signal $f_{in}$. Then, the detector 7 feeds an interruption signal $S_7$ to the selectors 31A and 35A. In response, the selectors 31A and 35A each fixedly outputs a control quantity ZERO. As a result, in the frequency synchronization control, the output of the adder 32 is maintained at a value appearing just before the signal interruption while, in the phase synchronization control, the output is a ZERO. Hence, the voltage control signal $S_3$ from the frequency and phase control circuit 3 is held at a value appearing just before the interruption of the input clock signal $f_{in}$. It follows that the output clock signal $f_{out}$ from the VCO 5 does not fluctuate even when the input clock signal $f_{in}$ is interrupted.

What is claimed is:

1. A clock synchronizing circuit comprising:

a voltage-controlled oscillator (VCO) for producing an output signal whose oscillation frequency changes in response to control signals;

comparing means for comparing a phase of an input signal and a phase of said output signal to thereby generate a phase difference signal;

filtering means for filtering said phase difference signal to thereby output a filtered phase difference signal;

frequency synchronizing means responsive to said filtered phase difference signal for generating a first compensation signal for controlling a frequency of said output signal;

phase synchronizing means responsive to said filtered phase difference signal for generating a second compensation signal for controlling a phase of said output signal;

means for feeding said first and second compensation signals as said control signals;

means for generating an interruption signal on detecting interruption of said input signal; and means responsive to said interruption signal for controlling generation of said first and second compensation signals, wherein said frequency synchronizing means comprises a plurality of selectors for outputting predetermined control quantities signals in response to respective output signals from said filtering means and said interruption signal generating means, and a plurality of adders, a first adder being coupled to a first selector of said plurality of selectors and for receiving an output from said first selector, wherein a second adder of said plurality of adders is for receiving an output from another selector of said plurality of selectors.

2. A clock synchronizing circuit comprising:

a voltage-controlled oscillator (VCO) for producing an output signal whose oscillation frequency changes in response to control signals;

comparing means for comparing a phase of an input signal and a phase of said output signal to thereby generate a phase difference signal;

filtering means for filtering said phase difference signal to thereby output a filtered phase difference signal;

frequency synchronizing means responsive to said filtered phase difference signal for generating a first compensation signal for controlling a frequency of said output signal;

phase synchronizing means responsive to said filtered phase difference signal for generating a second compensation signal for controlling a phase of said output signal;

means for feeding said first and second compensation signals as said control signals;

means for generating an interruption signal on detecting interruption of said input signal; and means responsive to said interruption signal for controlling generation of said first and second compensation signals, wherein said frequency synchronizing means comprises a plurality of selectors for outputting predetermined control quantities signals in response to respective output signals from said filtering means and said interruption signal generating means, and a plurality of adders, a first adder being coupled to a first selector of said plurality of selectors and for receiving an output from said first selector, wherein said frequency synchronizing means further comprises a plurality of flipflops, a first flipflop of said plurality of flipflops for receiving an output from said first adder and for providing an output to a second adder of said plurality of adders and a feedback signal to said first adder.

3. A circuit according to claim 2, wherein a second flipflop of said plurality of flipflops is for receiving said filtered phase difference signal from said filtering means and for outputting a signal to a second selector of said plurality of selectors.

4. A circuit according to claim 1, wherein said another selector of said plurality of selectors is for receiving an output from yet another selector of said plurality of selectors and said interruption signal and for providing an output to said second adder of said plurality of adders.

5. A circuit according to claim 4, further comprising means for generating a temperature compensation signal matching an ambient temperature, wherein said second adder receives an input from said temperature compensation signal generating means.

6. A clock synchronizing circuit comprising:

a voltage-controlled oscillator (VCO) for producing an output signal whose oscillation frequency changes in response to control signals;

comparing means for comparing a phase of an input signal and a phase of said output signal to thereby generate a phase difference signal;

filtering means for filtering said phase difference signal to thereby output a filtered phase difference signal;

frequency synchronizing means responsive to said filtered phase difference signal for generating a first compensation signal for controlling a frequency of said output signal;

phase synchronizing means responsive to said filtered phase difference signal for generating a second compensation signal for controlling a phase of said output signal;

means for feeding said first and second compensation signals as said control signals;

means for generating an interruption signal on detecting interruption of said input signal; and means responsive to said interruption signal for controlling generation of said first and second compensation signals, wherein said frequency synchronizing means comprises a plurality of selectors for outputting predetermined control quantities signals in response to respective output signals from said filtering means and said interruption signal generating means, and a plurality of adders, a first adder being coupled to a first selector of said plurality of selectors and for receiving an output from said first selector, wherein said frequency synchronizing means further comprises a digital-to-analog (D/A) converter for receiving an output from a second adder of said plurality of adders and for providing an output to said voltage-controlled oscillator, said second adder being operatively coupled to another selector of said plurality of selectors and for receiving an output of said another selector of said plurality of selectors.

7. A clock synchronizing circuit comprising:

a voltage-controlled oscillator (VCO) for producing an output signal whose oscillation frequency changes in response to control signals;

comparing means for comparing a phase of an input signal and a phase of said output signal to thereby generate a phase difference signal;

filtering means for filtering said phase difference signal to thereby output a filtered phase difference signal;

frequency synchronizing means responsive to said filtered phase difference signal for generating a first compensation signal for controlling a frequency of said output signal;

phase synchronizing means responsive to said filtered phase difference signal for generating a second compensation signal for controlling a phase of said output signal;

means for feeding said first and second compensation signals as said control signals;

means for generating an interruption signal on detecting interruption of said input signal; and means responsive to said interruption signal for controlling generation of said first and second compensation signals, wherein said frequency synchronizing means comprises a plurality of selectors for outputting predetermined control quantities signals in response to respective output signals from said filtering means and said interruption signal generating means, and a plurality of adders, first adder being coupled to a first selector of said plurality of selectors and for receiving an output from said first selector, wherein a second adder of said plurality of adders is for receiving an output from another selector of said plurality of selectors.

means for generating a temperature compensation signal matching an ambient temperature; and means for adding said temperature compensation signal to said control signals, wherein said temperature compensation signal generating means comprises a temperature-to-voltage (T/V) converter for outputting a voltage signal corresponding to the ambient temperature.

8. A circuit according to claim 7, wherein said temperature compensation signal generating means further comprises a read-only memory (ROM) coupled to said T/V converter for generating a temperature compensation signal corresponding to the ambient temperature.

9. A circuit according to claim 8, wherein said temperature compensation signal generating means further comprises:

a flipflop coupled to said frequency synchronizing means; and a comparator for receiving an input from said ROM and an input fedback from said flipflop.

10. A circuit according to claim 9, wherein said temperature compensation signal generating means further comprises a selector coupled to receive an output from said comparator for selecting a predetermined control quantity signal.

11. A circuit according to claim 10, wherein said temperature compensation signal generating means further comprises an adder for providing an output to said flipflop based on an output from said selector and said signal fedback from said flipflop such that said predetermined control quantity signal is added to a current control voltage.

12. A circuit according to claim 9, further comprises a sampling signal used in said filtering means has a same frequency as that of a sampling signal for said flipflop of said temperature compensation signal generating means, and wherein said ROM stores voltage data such that when a temperature change causes a frequency change, the voltage data compensate the frequency change to adjust the frequency.

13. A clock synchronizing circuit comprising:

a voltage-controlled oscillator (VCO) for producing an output signal whose oscillation frequency changes in response to control signals;

comparing means for comparing a phase of an input signal and a phase of said output signal to thereby generate a phase difference signal;

filtering means for filtering said phase difference signal to thereby output a filtered phase difference signal;

frequency synchronizing means responsive to said filtered phase difference signal for generating a first compensation signal for controlling a frequency of said output signal;

phase synchronizing means responsive to said filtered phase difference signal for generating a second compensation signal for controlling a phase of said output signal;

means for feeding said first and second compensation signals as said control signals;

means for generating an interruption signal on detecting interruption of said input signal; and means responsive to said interruption signal for controlling generation of said first and second compensation signals, wherein said frequency synchronizing means comprises a plurality of selectors, at least some of which selectively receive said interruption signal from said interruption means, wherein when said interruption signal from said interruption means is absent, first and second selectors of said plurality of selectors output a first predetermined control quantity signal depending upon said filtered phase difference signal received by said frequency synchronizing means having either a first state or a second state, wherein said frequency synchronizing means further comprises a flipflop for receiving said filtered phase difference signal, wherein when said interruption signal from said interruption means is absent, third and fourth selectors of said plurality of selectors output a second predetermined control quantity signal depending upon an output of said flipflop having either a first state or a second state, and wherein said first predetermined control quantity signal is used when a phase difference between input and output clocks of said circuit is larger than a predetermined value and wherein said second predetermined control quantity signal is used when the phase difference between the input and output clocks of said circuit is no more than a predetermined value.

* * * * *